United States Patent
Huang (10) Patent No.: US 11,011,637 B2
(45) Date of Patent: May 18, 2021

(54) SEMICONDUCTOR STRUCTURE HAVING BURIED GATE, BURIED SOURCE AND DRAIN CONTACTS, AND STRAINED SILICON AND METHOD OF MANUFACTURING THE SAME

(71) Applicant: NANYA TECHNOLOGY CORPORATION, New Taipei (TW)

(72) Inventor: Tse-Yao Huang, Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/547,331

(22) Filed: Aug. 21, 2019

(65) Prior Publication Data
US 2021/0057578 A1    Feb. 25, 2021

(51) Int. Cl.
| H01L 29/78 | (2006.01) |
| H01L 29/423 | (2006.01) |
| H01L 27/108 | (2006.01) |
| H01L 29/66 | (2006.01) |

(52) U.S. Cl.
CPC .... *H01L 29/7848* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 29/4236* (2013.01); *H01L 29/66621* (2013.01); *H01L 29/66636* (2013.01)

(58) Field of Classification Search
CPC ........... H01L 29/7848; H01L 27/10814; H01L 27/10823; H01L 27/10855; H01L 27/10876
See application file for complete search history.

(56) References Cited

U.S. PATENT DOCUMENTS

| 5,698,869 A * | 12/1997 | Yoshimi | H01L 27/1203 257/192 |
| 8,716,091 B2 * | 5/2014 | Cohen | H01L 29/45 438/300 |
| 10,026,830 B2 * | 7/2018 | Liu | H01L 29/7851 |
| 2005/0230734 A1 * | 10/2005 | Ha | H01L 27/10817 257/306 |
| 2012/0299098 A1 * | 11/2012 | Liu | H01L 29/7923 257/347 |
| 2013/0240996 A1 * | 9/2013 | Yin | H01L 29/66545 257/368 |

* cited by examiner

*Primary Examiner* — Zandra V Smith
*Assistant Examiner* — Andre C Stevenson
(74) *Attorney, Agent, or Firm* — Muncy, Geissler, Olds & Lowe, P.C.

(57) ABSTRACT

The present disclosure provides a semiconductor structure and a method for preparing the semiconductor structure. The semiconductor structure includes a substrate; a drain disposed in the substrate; a drain contact disposed in the drain; a source disposed in the substrate; a source contact disposed in the source; a gate structure with a bottom disposed in the substrate between the drain and the source; a channel disposed at the bottom of the gate structure connecting the drain and the source; a drain stressor disposed in the drain between the gate structure and the drain contact; a drain strained silicon layer disposed in the substrate surrounding the drain stressor connected to the channel; a source stressor disposed in the source between the source contact and the gate structure; and a source strained silicon layer disposed in the substrate surrounding the source stressor connected to the channel.

20 Claims, 8 Drawing Sheets

SEMICONDUCTOR STRUCTURE HAVING BURIED GATE, BURIED SOURCE AND DRAIN CONTACTS, AND STRAINED SILICON AND METHOD OF MANUFACTURING THE SAME

TECHNICAL FIELD

The present disclosure relates to a semiconductor structure and a method for manufacturing the same, and more particularly, to a semiconductor structure having a buried gate, buried source and drain contacts, and strained silicon and a method of manufacturing the same.

DISCUSSION OF THE BACKGROUND

Semiconductor devices are widely used in the electronics industry because of their small sizes, multi-functional characteristics, and/or low fabrication costs, among other advantages. Reducing the size of semiconductor devices results in improved performance, increased capacity, and/or reduced cost. However, semiconductor devices have become highly integrated during the advancement of the electronics industry. Widths and spaces of patterns included in semiconductor devices have been reduced to increase the integration density of semiconductor devices. Size reduction, however, requires more sophisticated techniques for IC manufacturing, Since new and/or expensive exposure techniques are needed to form fine patterns, there exist increasing difficulties in continuing to highly integrate semiconductor devices. In order to continue reducing the scale of semiconductor devices, many techniques have been proposed in recent years for future generation development.

Moreover, to enhance the performance of the semiconductor devices, strained silicon has been used. Strained silicon is a layer of silicon in which the silicon atoms are stretched beyond their normal interatomic distance. Moving these silicon atoms farther apart reduces the atomic forces that interfere with the movement of electrons through the transistors and thus improves carrier mobility, resulting in better chip performance and lower energy consumption. This can be accomplished by putting the layer of silicon over a substrate of, for example, silicon germanium (SiGe), in which the atoms are arranged farther apart than those of a silicon substrate.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises a substrate; a drain, disposed in the substrate; a drain contact, disposed in the drain; a source, disposed in the substrate; a source contact, disposed in the source; a gate structure with a bottom, disposed in the substrate between the drain and the source; a channel, disposed at the bottom of the gate structure, connecting the drain and the source; a drain stressor, disposed in the drain, between the gate structure and the drain contact; a drain strained silicon layer, disposed in the substrate surrounding the drain stressor, connected to the channel; a source stressor, disposed in the source, between the source contact and the gate structure; and a source strained silicon layer, disposed in the substrate surrounding the source stressor, connected to the channel.

In one embodiment of the present disclosure, the gate structure comprises a first conductive layer.

In one embodiment of the present disclosure, the gate structure further comprises a gate insulation layer separating the first conductive layer of the gate structure from the source, the drain and the channel.

In one embodiment of the present disclosure, the semiconductor structure further comprises a metal silicide layer, disposed on the first conductive layer of the gate structure.

In one embodiment of the present disclosure, the semiconductor structure further comprises a bit line connected to the drain contact.

In one embodiment of the present disclosure, the bit line comprises a first electrode connected to the drain contact and a second electrode connected to the first electrode.

In one embodiment of the present disclosure, the semiconductor structure further comprises a bit line insulation layer disposed on the bit line, and a bit line spacer disposed on a sidewall of the bit line.

In one embodiment of the present disclosure, the semiconductor structure further comprises a storage node connected to the source contact.

In one embodiment of the present disclosure, the storage node comprises a lower contact plug connected to the source contact, and an upper contact plug disposed on the lower contact plug.

The semiconductor structure of Claim 9, further comprising a storage capacitor having a landing pad disposed on the upper contact plug, and a storage node spacer covering sidewall of the storage node.

Another aspect of the present disclosure provides a method of manufacturing a semiconductor structure. The method of manufacturing the semiconductor structure comprises the steps of providing a substrate; forming a drain and a source in the substrate; forming a channel connecting the drain and the source by forming a gate structure with a bottom in the substrate between the drain and the source, wherein the channel is disposed at the bottom of the gate structure; forming a drain strained silicon layer and a source strained silicon layer by forming a drain stressor in the drain and a source stressor in the source, wherein the drain strained silicon layer and the source strained silicon layer are connected by the channel; forming a drain contact in the drain and a source contact in the source, wherein the drain stressor is disposed between the drain contact and the gate structure and the source stressor is disposed between the source contact and the gate structure.

In one embodiment of the present disclosure, the substrate comprises silicon.

In one embodiment of the present disclosure, the drain stressor and the source stressor comprise silicon-germanium.

In one embodiment of the present disclosure, the method of manufacturing a semiconductor structure further comprises the step of forming a bit line over the drain contact.

In one embodiment of the present disclosure, the step of forming a bit line thither comprises the steps of: forming a first electrode connected to the drain contact; and forming a second electrode connected to the first electrode.

In one embodiment of the present disclosure, the method of manufacturing a semiconductor structure further comprises steps of forming a bit line insulation layer on the second electrode; and forming a bit line spacer on a sidewall of the bit line.

In one embodiment of the present disclosure, the method of manufacturing a semiconductor structure further comprises the step of forming a storage node over the source contact.

In one embodiment of the present disclosure, the step of forming a storage node over the source contact comprises: forming a lower contact plug over the source contact; and forming an upper contact plug over the lower contact plug.

In one embodiment of the present disclosure, the lower contact plug is integrally formed with the first electrode of the bit line, and the upper contact plug is integrally formed with the second electrode of the bit line.

In one embodiment of the present disclosure, the step of forming the gate structure comprises the steps of: forming a gate trench on the substrate; forming a gate insulation layer in the trench; forming a first conductive layer in the trench, on the gate insulation layer; and forming a second conductive layer on the first conductive layer.

The semiconductor structure disclosed in the present disclosure includes a gate structure disposed in a gate trench; that is, the gate is buried in the substrate. The buried gate is completely buried under the surface of the substrate so that the subsequently formed structures can be at the same level as the top surface of the substrate, which results in a structure with smaller size. Moreover, the drain contact and the source contact are also buried in the substrate, under the surface of the substrate, which further facilitates size reduction.

In the present disclosure, the drain stressor and the source stressor are employed to increase the interatomic distance of the substrate and therefore create a layer with a strained silicon layer. The mobility of the carriers in the strained silicon layer may be significantly greater than that in prior silicon layers. This feature, combined with the buried gate structure and the buried contacts, results in a product with better performance, lower energy consumption and greater reliability.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
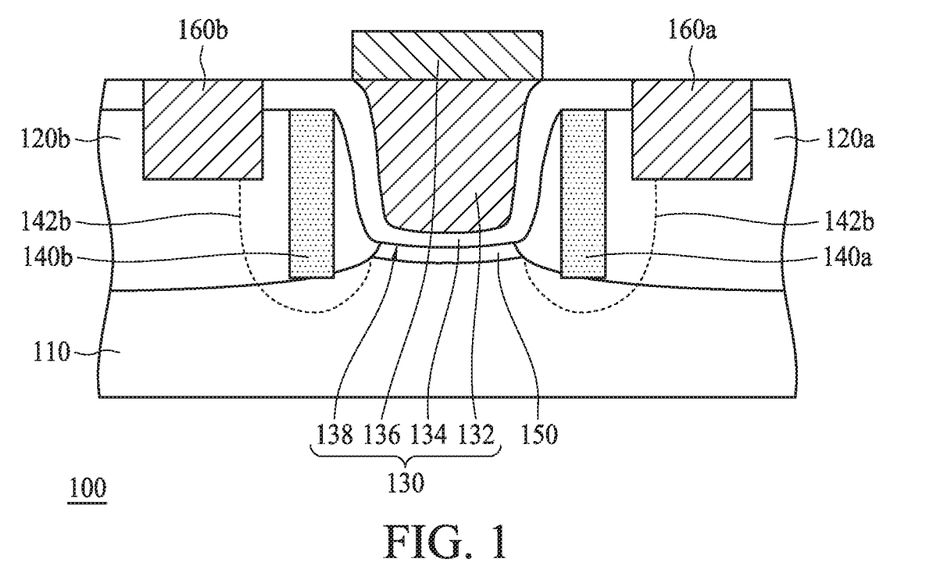
FIG. 1 is a cross-sectional view of a semiconductor structure in accordance with some embodiments of the present disclosure.

FIG. 1 is a cross-sectional view of a semiconductor structure in accordance with some embodiments of the present disclosure. Please refer to FIG. 1. The semiconductor structure 100 provided by the present disclosure includes a substrate 110. A drain 120a and a source 120b are disposed in the substrate 110. The semiconductor structure 100 further includes a gate structure 130 disposed in the substrate 110, between the drain 120a and the source 120b. In one embodiment, the gate structure 130 is a combination of a first conductive layer 132, a gate insulation layer 134, and a second conductive layer 136. The gate structure 130 induces the formation of a channel 150 at a bottom 138 of the gate structure 130 in the substrate 110. The channel 150 connects the drain 120a and the source 120b. The gate structure 130 is disposed mostly in the substrate 110 so that the semiconductor structure 100 has a more compact configuration.

A drain stressor 140a and a source stressor 140b are also disposed in the drain 120a and in the source 120b, respectively. The crystalline structures of the drain stressor 140a and the source stressor 140b include wider interatomic spaces, so the interatomic spaces of portions of the drain 120a around the drain stressor 140a and portions of the source 120b around the source stressor 140b are extended. For example, in one embodiment, the substrate 110 may be a silicon substrate, and the drain stressor 140a and the source stressor 140b may be made of silicon germanium (SiGe).

The wider interatomic spaces of the silicon germanium affect the surrounding silicon crystalline structure and create a drain strained silicon layer 142a and a source strained silicon layer 142b in the drain 120a and in the source 120b, respectively. The wider interatomic spaces in the drain strained silicon layer 142a and the source strained silicon layer 142b allow the carriers to move in these regions with less interference from the surrounding atoms and thus improves the mobility of the carriers in the drain strained silicon layer 142a and the source strained silicon layer 142b.

The semiconductor structure 100 further includes a drain contact 160a and a source contact 160b disposed in the drain 120a and in the source 120b, respectively. The drain contact 160a and the source contact 160b are buried in the drain 120a and the source 120b, respectively, which further reduces the overall size of the semiconductor structure 100. In some embodiments, the drain contact 160a may be connected to a bit line, and the source contact 160b may be connected to a storage node when the semiconductor structure 100 is used in a semiconductor memory device.

Figure 2:
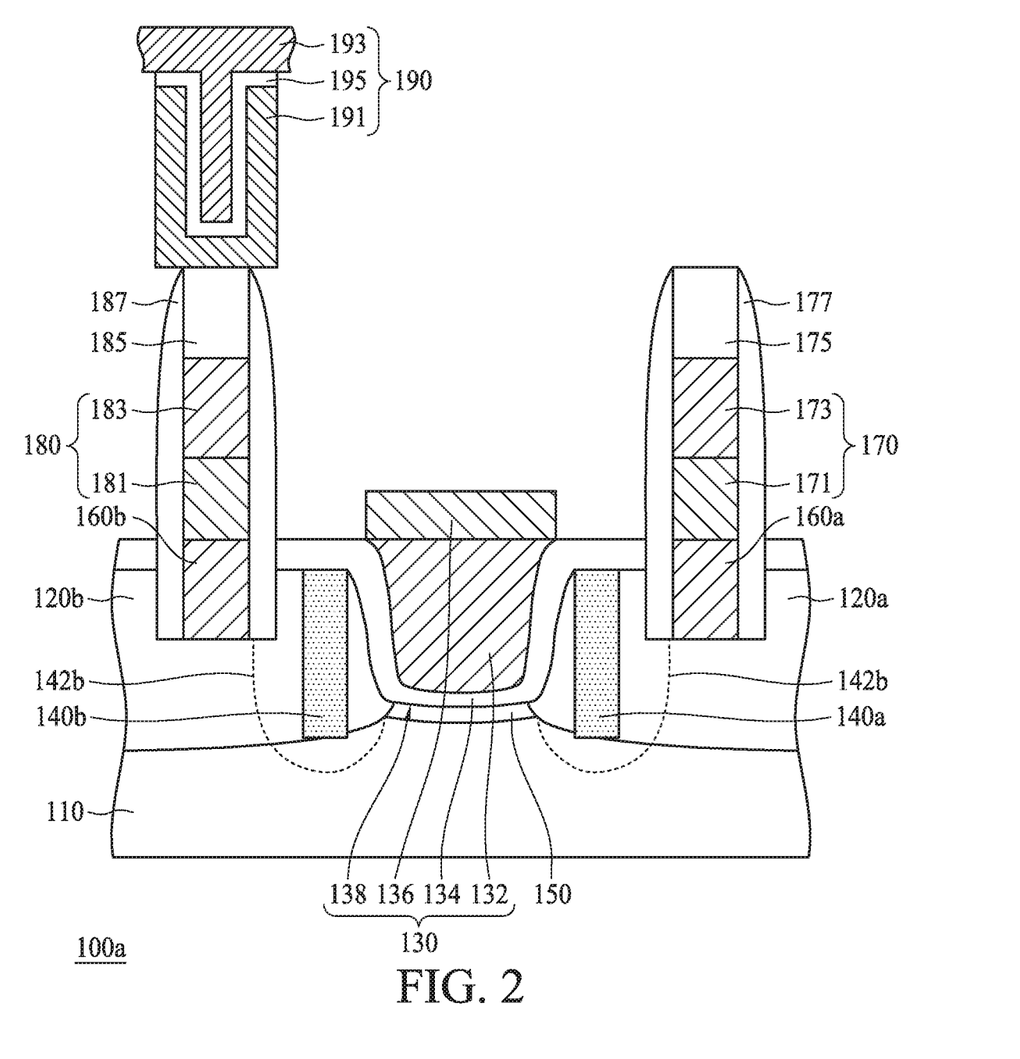
FIG. 2 is a cross-sectional view of a semiconductor structure in accordance with some other embodiments of the present disclosure.

FIG. 2 is a cross-sectional view of a semiconductor structure 100a in accordance with some embodiments of the present disclosure. Please refer to FIG. 2. When integrated into a semiconductor memory device, the semiconductor structure 100a in the present disclosure may include a hit line 170 and a storage node 180, which are connected to the drain contact 160a and the source contact 160b, respectively. In some embodiments of the present disclosure, the bit line 170 may comprise a first electrode 171, which is connected to the drain contact 160a in the drain 120a, and a second electrode 173 disposed on the first electrode 171. In one embodiment, the semiconductor structure 100a may further include a bit line insulation layer 175 disposed on the second electrode 173 and a bit line spacer 177 covering the sidewall of the bit line 170. In some embodiments, the storage node 180 is configured to connect the source contact 160b to a storage capacitor (not shown in the drawings), and may include a lower contact plug 181 and an upper contact plug 183. The lower contact plug 181 is connected to the source contact 160b, and the upper contact plug 183 is disposed on the lower contact plug 181. In one embodiment, the upper contact plug 183 of the storage node 180 contacts a landing pad 185 disposed on the upper contact plug 183, and a storage node spacer 187 covering the side of the storage node 180 and the landing pad 185.

Figure 3:
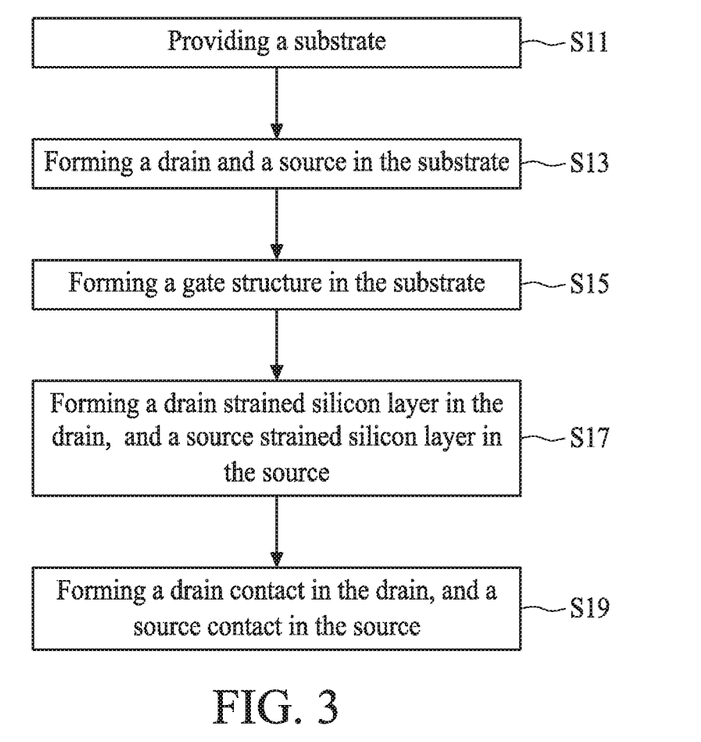
FIG. 3 is a flow diagram of a method of manufacturing a semiconductor structure in accordance with some embodiments of the present disclosure.
Figure 4:
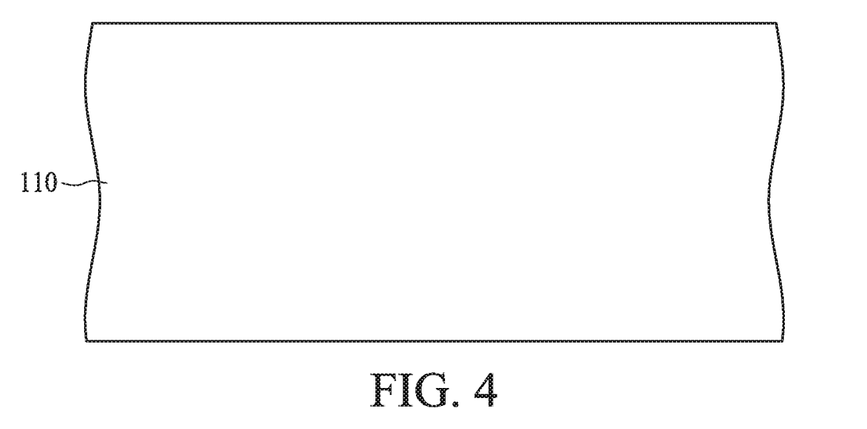
FIG. 4 to FIG. 13 are cross-sectional views showing the steps of a method of manufacturing a semiconductor structure in accordance with some embodiments of the present disclosure.

The method of manufacturing the semiconductor structure 100 and the semiconductor structure 100a is introduced below. FIG. 3 is a flow diagram of a method of manufacturing a semiconductor structure in accordance with some embodiments of the present disclosure, and FIG. 4 to FIG. 13 are cross-sectional views of the results of the steps of a method of manufacturing a semiconductor structure in accordance with some embodiments of the present disclosure. Please refer to FIG. 3 and FIG. 4. In step S11 of the method of manufacturing the semiconductor structure 100, a substrate 110 is provided. The substrate 100 may be a bulk silicon substrate or a silicon-on-insulator (SOI) substrate.

Figure 5:
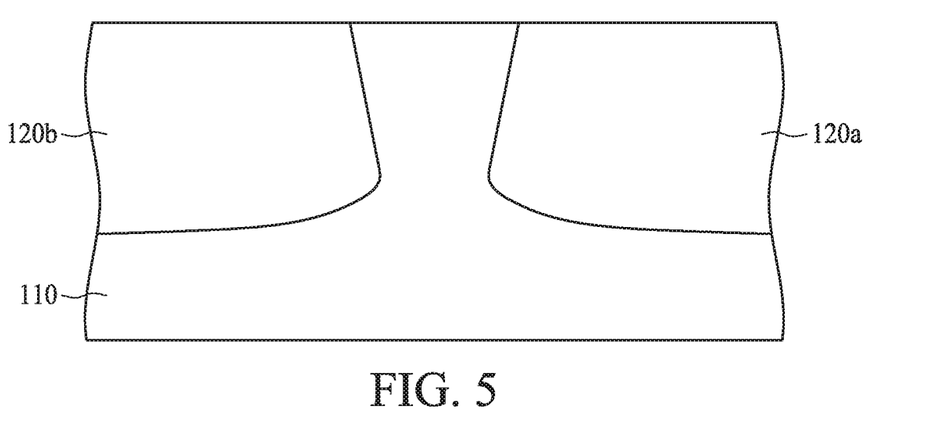

Next, please refer to FIG. 5. In step S13, a drain 120a and a source 120b are formed in the substrate 110. In some embodiments, the substrate 110 may be doped to form the drain 120a and the source 120b. For example, the substrate 110 may be implanted using diffusion implantation, in which a gas containing a dopant is introduced to the substrate 110, and the dopant diffuses into the exposed surface of the substrate 110 both vertically and horizontally, or ion implantation, in which a beam of purified dopant ions is directed to sweep over the surface of the substrate 110 and dope the exposed parts thereof. In some embodiments, an ion implantation mask (not shown) may be formed on the substrate 100, and an ion implantation process may be performed using the ion implantation mask to form the drain 120a and the source 120b. In some embodiments, the ion implantation process may be performed without the ion implantation mask.

Figure 6:
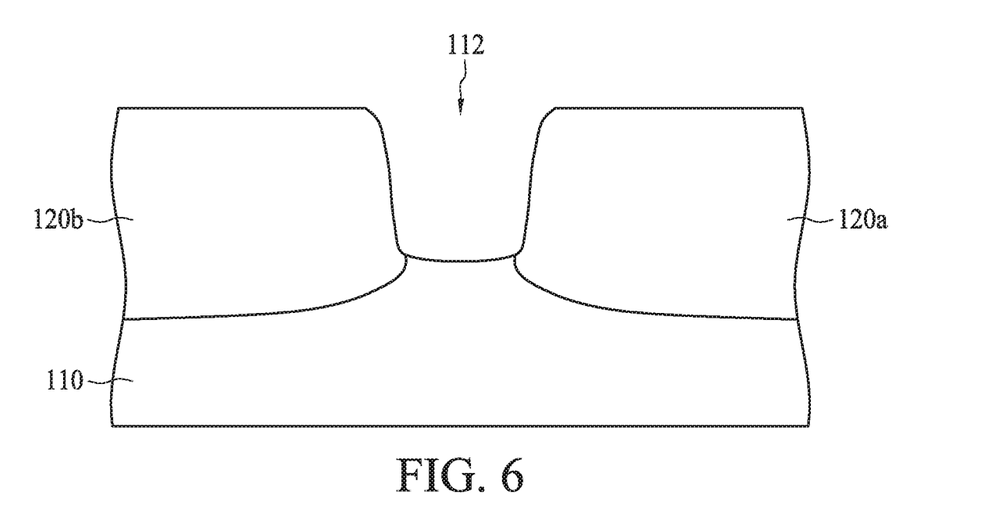

Next, in step S15, a gate structure 130 is formed in the substrate 110, between the drain 120a and the source 120b. In some embodiments, the formation of the gate structure 130 may further include several steps. For example, referring to FIG. 6, a gate trench 112 is formed on the substrate 110, between the drain 120a and the source 120b. In some embodiments, the gate trench 112 may be formed by selective etching. For example, in an embodiment where the substrate 110 is a silicon substrate, the substrate 110 can be etched with vapor hydrofluoric acid (VHF).

Figure 7:
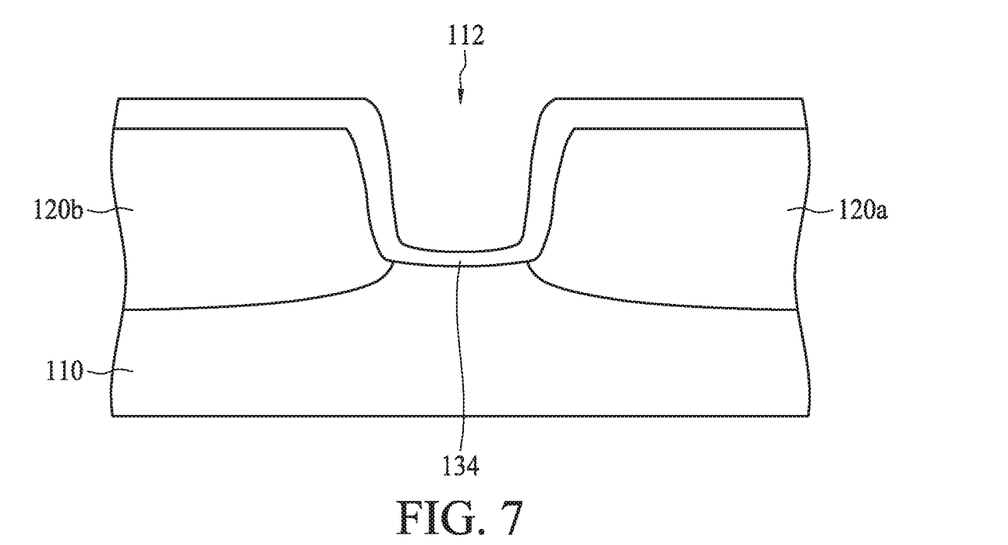

Next, referring to FIG. 7, a gate insulation layer 134 is formed in the gate trench 112. For example, the gate insulation layer 134 may be formed to cover an inner surface of the gate trench 112. The gate insulating layer 134 may be formed of an insulating material, e.g., a silicon oxide layer. In some embodiments, the formation of the gate insulation layer 134 may be achieved by performing a heat treatment on the substrate 110, wherein the heat treatment oxidizes the exposed surface of the substrate 110 and forms a passivation oxide layer on the substrate 110, including the inner surface of the gate trench 112.

Figure 8:
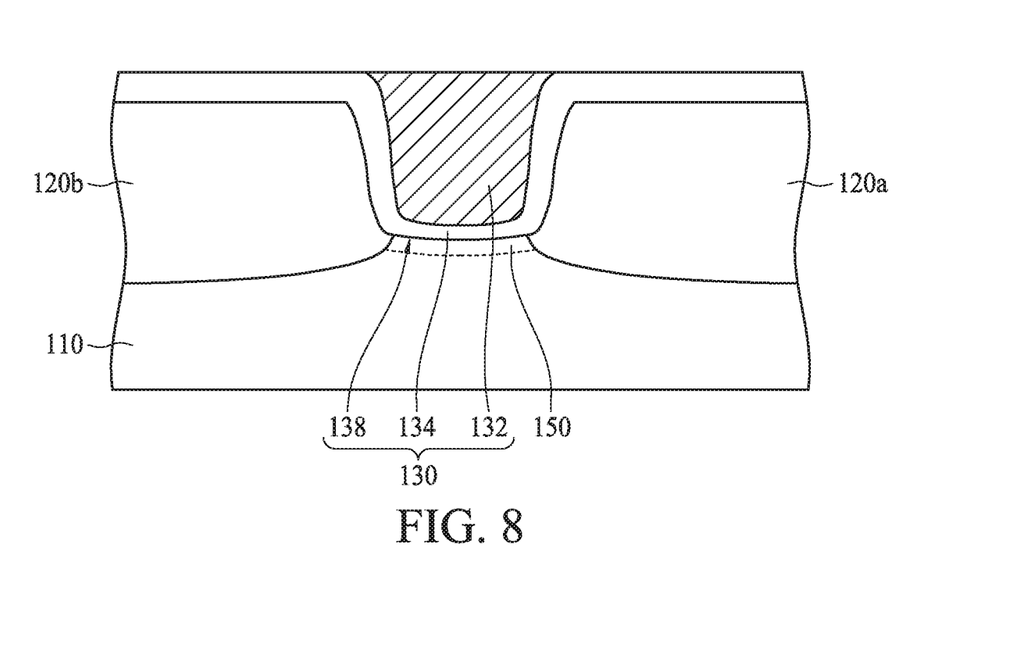

Next, in FIG. 8, a first conductive layer 132 is formed in the gate trench 112, on the gate insulation layer 134. In some embodiments, the first conductive layer 132 can be formed by depositing a metal layer (not shown) on the substrate 110 and in the gate trench 112, and then processing the metal layer until the metal layer is no higher than the surface of the substrate 110 and the remaining metal layer exists only in the gate trench 112. In such case, the metal layer may, for example, include a titanium nitride (TiN) layer, a tantalum nitride (TaN) layer, a tungsten (W) layer, or the like. The metal layer may then be planarized by chemical mechanical polishing (CMP) or the like. Subsequently, the metal layer is etched back and cleaned in such a manner that the metal layer is buried in only some parts of the trench, so that the first conductive layer 132 is formed. In some embodiments, the first conductive layer 132 can also be non-metal such as polycrystalline silicon. In such embodiments, a polycrystalline silicon layer (not shown) may be formed on the surface of the substrate 110 and in the gate trench 112 with low-pressure chemical vapor deposition (LPCVD). The polycrystalline silicon layer on the surface of the substrate 110 can then be etched back or planarized by CMP so that only the polycrystalline silicon layer in the gate trench 112 is left, thus forming the first conductive layer 132. By forming the conductive layer 132, a channel 150 is defined at the bottom 138 of the gate structure 130. The channel 150 connects the drain 120a and the source 120b.

Figure 9:
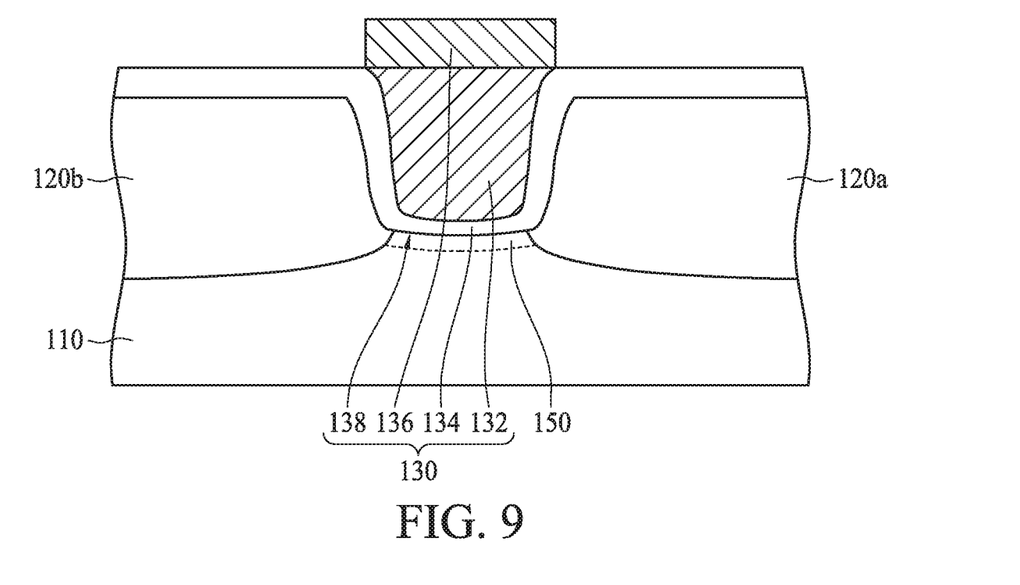

In some embodiments, a second conductive layer 136 can be formed on the first conductive layer 132. Please refer to FIG. 9. In some embodiments, the gate structure 130 may further include the second conductive layer 136 formed on the first conductive layer 132. In the embodiments wherein the first conductive layer 132 is metal, the second conductive layer 136 may be formed by depositing the titanium nitride layer and the tantalum nitride layer, or may be formed by sequentially depositing the titanium nitride layer, the tantalum nitride layer, and the tungsten layer, for example, to form the first conductive layer 132 and the second conductive layer 136. In some other embodiments wherein the first conductive layer 132 is polycrystalline silicon, the second conductive layer 136 may be a metal silicide layer.

Next, in step S17, the drain stressor 140a and the source stressor 140 are formed in the drain 120a and the source 120b, respectively. In some embodiments, step S17 may further include the step of forming a drain stressor recess 114a and a source stressor recess 114b. The formation of the drain stressor recess 114a and the source stressor recess 114b may be performed by selective etching in some embodiments. For example, a hard mask (not shown) that defines the drain stressor recess 114a and the source stressor recess 114b can be formed by a photolithography process, and the drain stressor recess 114a and the source stressor recess 114b may be formed using, for example, a wet etch process selective to the material of the substrate 110, wherein the wet etch process uses the hard mask to form the drain stressor recess 114a and the source stressor recess 114b. For example, an etchant, such as carbon tetrafluoride (CF4), tetramethylammonium hydroxide (THMA), combinations of these, or the like, may be used to perform the wet etch process and to form the drain stressor recess 114a and the source stressor recess 114b.

Figure 10:
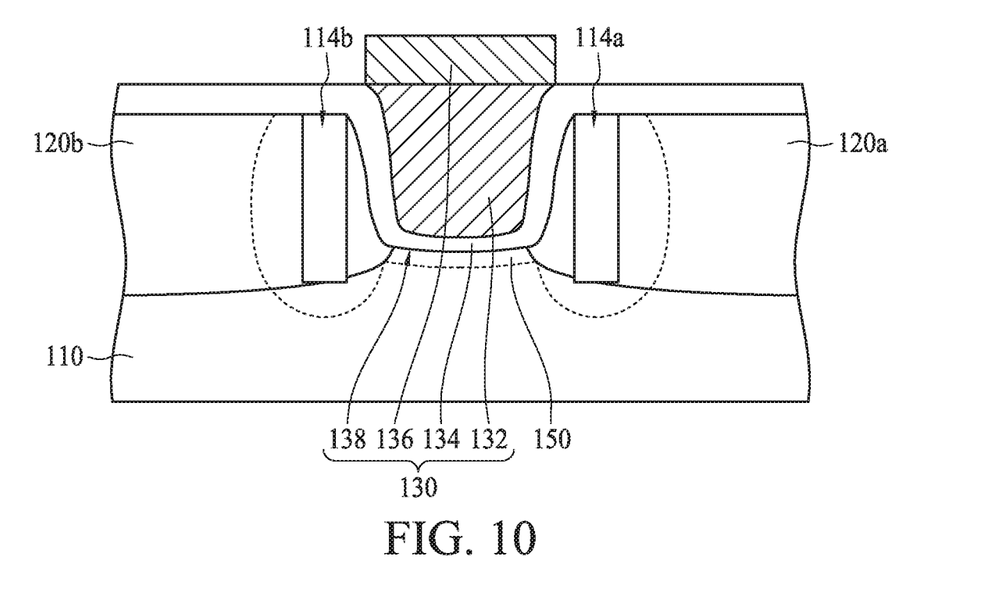
Figure 11:
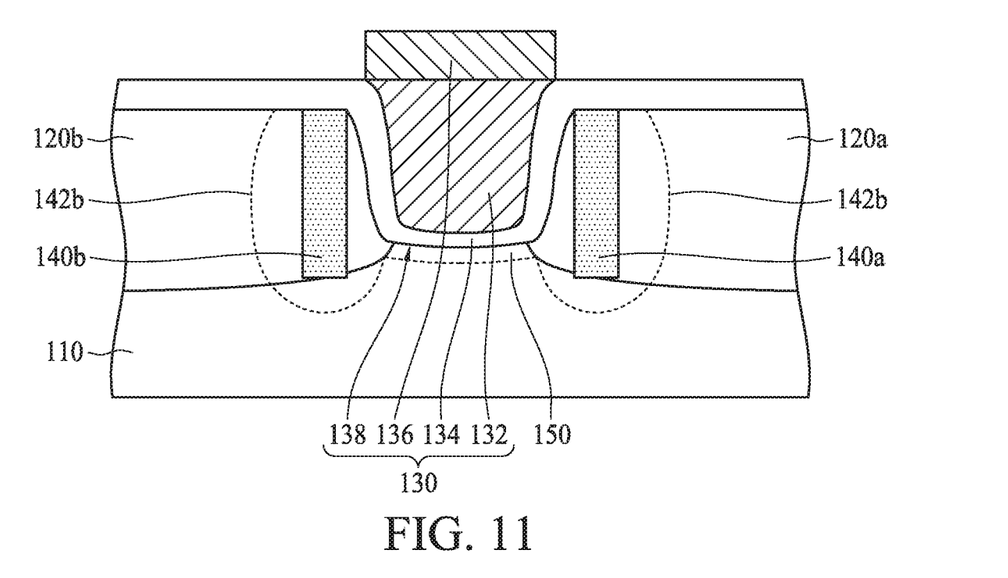

Next, the drain stressor 140a and the source stressor 140b are formed in the drain stressor recess 114a and the source stressor recess 114b, respectively. Please refer to FIG. 10 and FIG. 11. In some embodiments, the drain stressor 140a and the source stressor 140b may be formed by a cyclic deposition and etching (CDE) process. The CDE process includes an epitaxial deposition/partial etch process, which is repeated one or more times. In such case, a silicon-containing layer (not shown) is epitaxially deposited in the drain stressor recess 114a and the source stressor recess 114b. In some embodiments, the resulting metal-oxide-semiconductor (MOS) device is an nMOS device, and the silicon-containing layer may be made of, for example, silicon, silicon carbide, other semiconductor materials, and/or a combination thereof. The deposition of the silicon-containing layer may use at least one silicon-containing precursor, such as silane (SiH4), trisilane (Si3H8), disilane (Si2H6), dichlorosilane (SiH2Cl2), other silicon-containing precursors, and/or a combination thereof. In some embodiments, the deposition of the silicon-containing layer may include in-situ doping of the silicon-containing layer. When the resulting metal-oxide-semiconductor (MOS) device is an nMOS device, an n-type doping precursor, for example, phosphine (PH3) and/or other n-type doping precursors, may be used. As a result, the drain strained silicon layer 142a and the source strained silicon layer 142b are formed in the drain 120a and the source 120b, respectively.

Figure 12:
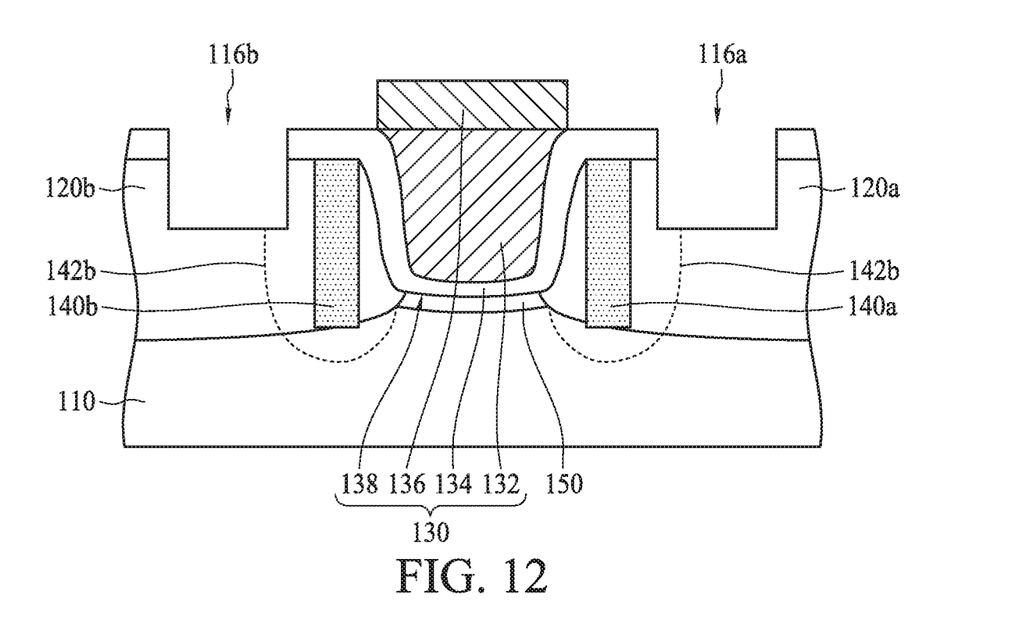

Finally, in step S19, a drain contact 160a is formed in the drain 120a and a source contact 160b is formed in the source 120b, as shown in FIG. 12 and FIG. 1. In some embodiments, the substrate 110 may be etched to form a drain contact hole 116a and a source contact hole 116b. Next, a conductive layer may be formed on the substrate 110 and in the drain contact hole 116a and the source contact hole 116b. In some embodiments, a planarization process (e.g., CMP) or an etch-back process may be performed on the conductive layer until only the conductive layer in the drain contact hole 116a and the source contact hole 116b remain, thereby forming the drain contact 160a and the source contact 160b. The drain contact 160a and the source contact 160b may include at least one of a metal silicide, doped poly-silicon, a metal nitride, or a metal.

Figure 13:
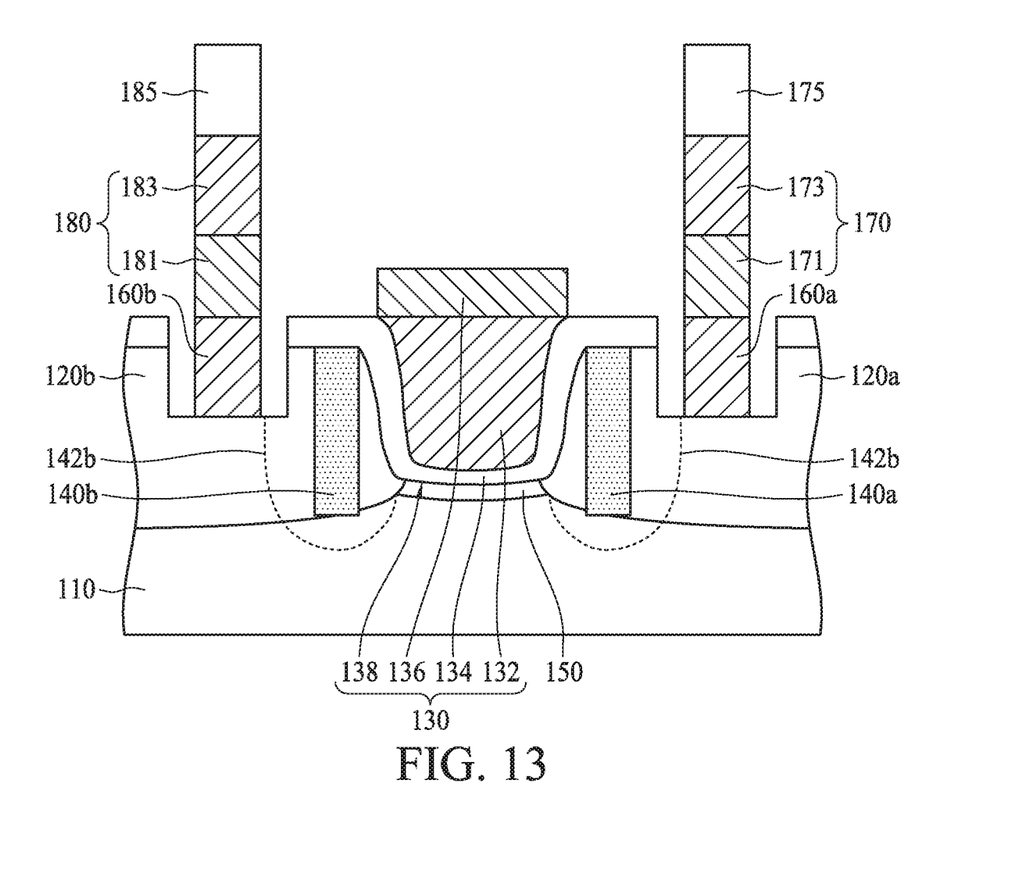

Please refer to FIG. 13. In some embodiments, when the semiconductor structure 100 is used in a semiconductor memory device, a bit line 170 can be formed to be connected to the drain contact 160a, and a storage node 180 can be connected to the source contact 160b. In some embodiments, the bit line 170 may include a first electrode 171 and a second electrode 173, which are sequentially stacked on the drain contact 160a. For example, the first electrode 171 may include doped poly-silicon. The second electrode 173 may include at least one of tungsten (W), aluminum (Al), copper (Cu), nickel (Ni), or cobalt (Co). In one embodiment, a diffusion barrier layer (not shown) may be formed between the first electrode 171 and the second electrode 173. The diffusion barrier layer may be a diffusion barrier metal and may include, for example, TiN, Ti/TiN, TiSiN, TaN, or WN. In some embodiments, the semiconductor structure 100a may further include a bit line insulation layer 175 disposed on the second electrode 173, and a bit line spacer 177 covering the side of the bit line 170.

In some embodiments, a storage node 180 can be formed to be connected to the source contact 160b. For example, the storage node 180 may include a lower contact plug 181 and an upper contact plug 183 disposed on the lower contact plug 181. The storage node 180 may be formed by a process similar to the process of forming the bit line 170, i.e., the lower contact plug 181 is integrally formed with the first electrode 171 of the hit line 170, and the upper contact plug 183 is integrally formed with the second electrode 173 of the bit line 170. In some embodiments, a landing pad 185 is formed over the storage node 180, and a storage node spacer 187 is then formed to cover the sidewall of the storage node 180. In some embodiments, a storage capacitor 190 is disposed over the landing pad 185, and includes a lower electrode 181, an upper electrode 183 and a dielectric layer 185 between the lower electrode 181 and the upper electrode 183

The gate structure 130 is disposed in the gate trench 112 in the substrate 110, the drain contact 160a is disposed in the drain contact hole 116a, and the source contact 160b is disposed in the source contact hole 116b. That is, the gate structure 130, the drain contact 160a, and the source contact 160b are buried in the substrate 110, below the top surface of the substrate 110. The buried gate parts reduce the height of the semiconductor structure 100 so that other semiconductor structures formed on the semiconductor structure 100 can form a more compact profile.

Moreover, the drain stressor 140a and the source stressor 140b create the drain strained silicon layer 142a and the source strained silicon layer 142b in the drain 120a and the source 120b, respectively. The atoms of the drain strained silicon layer 142a and the source strained silicon layer 142b are stretched farther apart from each other by the drain stressor 140a and the source stressor 140b, which leaves the carriers with larger interatomic spaces. The carriers therefore are subject to less interference from the interatomic forces when moving in the drain strained silicon layer 142a and the source strained silicon layer 142b, which results in greater mobility of carriers in these regions. This feature, combined with the buried gate, results in a product with lower cost, more functionality, better performance, lower energy consumption and greater reliability.

In one embodiment, the present disclosure provides a semiconductor including a substrate, a drain, a drain contact, a source, a source contact, a gate structure, and a channel. The drain and the source are disposed in the substrate, and the drain contact is disposed in the drain while the source contact is disposed in the source. The gate structure includes a bottom and is disposed in the substrate between the drain and the source. The channel is disposed at the bottom of the gate structure, and connects the drain and the source. The semiconductor structure further includes a drain stressor, a drain strained silicon layer, a source stressor, and a source strained silicon layer. The drain stressor is disposed in the drain, between the gate structure and the drain contact. The source stressor is disposed in the source, between the source contact and the gate structure. The drain strained silicon layer is disposed in the substrate surrounding the drain stressor, and is connected to the channel. The source strained silicon layer is disposed in the substrate surrounding the source stressor, and is connected to the channel.

In another embodiment, the present disclosure provides a method of manufacturing semiconductor. The method begins with the step of providing a substrate. Next, a drain and a source are formed in the substrate. Next, a channel connecting the drain and the source are formed by forming a gate structure with a bottom in the substrate between the drain and the source. The channel is disposed at the bottom of the gate structure, Next, a drain strained silicon layer and a source strained silicon layer are formed by forming a drain stressor in the drain and a source stressor in the source. The drain strained silicon layer and the source strained silicon layer are connected by the channel, Finally, a drain contact and a source contact are formed in the drain and the source, respectively. The drain stressor is disposed between the drain contact and the gate structure, and the source stressor is disposed between the source contact and the gate structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor structure, comprising:
a substrate;
a drain, disposed in the substrate;
a drain contact, disposed in the drain;
a source, disposed in the substrate;
a source contact, disposed in the source;
a gate structure with a bottom, disposed in the substrate between the drain and the source;
a channel, disposed at the bottom of the gate structure, and connecting the drain and the source;
a drain stressor, disposed in the drain and extending from a top of the drain to the substrate, between the gate structure and the drain contact;
a drain strained silicon layer, disposed in the substrate surrounding the drain stressor, and connected to the channel;
a source stressor, disposed in the source and extending from a top of the source to the substrate, between the source contact and the gate structure; and
a source strained silicon layer, disposed in the substrate surrounding the source stressor, and connected to the channel.

2. The semiconductor structure of claim 1, wherein the gate structure comprises a first conductive layer.

3. The semiconductor structure of claim 2, wherein the gate structure further comprises a gate insulation layer separating the first conductive layer of the gate structure from the source, the drain and the channel.

4. The semiconductor structure of claim 2, further comprising a metal silicide layer, disposed on the first conductive layer of the gate structure.

5. The semiconductor structure of claim 1, further comprising a bit line connected to the drain contact.

6. The semiconductor structure of claim 5, wherein the bit line comprises a first electrode connected to the drain contact and a second electrode connected to the first electrode.

7. The semiconductor structure of claim 5, further comprising a bit line insulation layer disposed on the bit line, and a bit line spacer disposed on a sidewall of the bit line.

8. The semiconductor structure of claim 1, further comprising a storage node connected to the source contact.

9. The semiconductor structure of claim 8, wherein the storage node comprises a lower contact plug connected to the source contact, and an upper contact plug disposed on the lower contact plug.

10. The semiconductor structure of claim 9, further comprising a storage capacitor having a landing pad disposed on the upper contact plug, and a storage node spacer covering sidewall of the storage node.

11. A method of manufacturing a semiconductor structure, comprising the steps of:
providing a substrate;
forming a drain and a source in the substrate;
forming a channel connecting the drain and the source by forming a gate structure with a bottom in the substrate between the drain and the source, wherein the channel is disposed at the bottom of the gate structure;
forming a drain strained silicon layer and a source strained silicon layer by forming a drain stressor in the drain and a source stressor in the source, wherein the drain strained silicon layer and the source strained silicon layer are connected by the channel, wherein the drain stressor extends from a top of the drain to the substrate, the source stressor extends from a top of the source to the substrate, and the drain strained silicon layer and the source strained silicon layer respectively surround the drain stressor and the source stressor; and
forming a drain contact in the drain and a source contact in the source, wherein the drain stressor is disposed between the drain contact and the gate structure and the source stressor is disposed between the source contact and the gate structure.

12. The method of manufacturing a semiconductor structure of claim 11, wherein the substrate comprises silicon.

13. The method of manufacturing a semiconductor structure of claim 12, wherein the drain stressor and the source stressor comprise silicon-germanium.

14. The method of manufacturing a semiconductor structure of claim 11, further comprising the step of forming a bit line over the drain contact.

15. The method of manufacturing a semiconductor structure of claim 14, wherein the step of forming a bit line further comprises the steps of:
- forming a first electrode connected to the drain contact; and
- forming a second electrode connected to the first electrode.

16. The method of manufacturing a semiconductor structure of claim 15, further comprising steps of:
- forming a bit line insulation layer on the second electrode; and
- forming a bit line spacer on a sidewall of the bit line.

17. The method of manufacturing a semiconductor structure of claim 15, further comprising the step of forming a storage node over the source contact.

18. The method of manufacturing a semiconductor structure of claim 17, wherein the step of forming a storage node over the source contact comprises:
- forming a lower contact plug over the source contact; and
- forming an upper contact plug over the lower contact plug.

19. The method of manufacturing a semiconductor structure of claim 17, wherein the lower contact plug is integrally formed with the first electrode of the bit line, and the upper contact plug is integrally formed with the second electrode of the bit line.

20. The method of manufacturing a semiconductor structure of claim 11, wherein the step of forming the gate structure comprises the steps of:
- forming a gate trench on the substrate;
- forming a gate insulation layer in the trench;
- forming a first conductive layer in the trench, on the gate insulation layer; and
- forming a second conductive layer on the first conductive layer.

* * * * *